(12) United States Patent
Dasgupta et al.

(10) Patent No.: US 8,749,274 B1
(45) Date of Patent: Jun. 10, 2014

(54) LEVEL SENSITIVE COMPARING DEVICE (71) Applicant: MediaTek Singapore Pte. Ltd., Singapore (SG)

(72) Inventors: Uday Dasgupta, Singapore (SG); Chong Huang, Singapore (SG)

(73) Assignee: MediaTek Singapore Pte. Ltd., Solaris, Singapore (SG)

( * ) Notice: Subject to any disclaimer, the term of this patent is extended or adjusted under 35 U.S.C. 154(b) by 0 days.

(21) Appl. No.: 13/802,826

(22) Filed: Mar. 14, 2013

(51) Int. Cl.
*H03K 5/22* (2006.01)
*H03K 5/153* (2006.01)
*H03K 5/08* (2006.01)
*G01R 19/165* (2006.01)

(52) U.S. Cl.
CPC ............. *H03K 5/08* (2013.01); *G01R 19/1659* (2013.01)
USPC .................. 327/74; 327/75; 327/76

(58) Field of Classification Search
CPC .............................. H03K 5/08; G01R 19/1659
USPC .............................................. 327/74, 75, 76
See application file for complete search history.

(56) References Cited

U.S. PATENT DOCUMENTS

| | | | | |
|---|---|---|---|---|
| 4,859,872 | A * | 8/1989 | Hyakutake | 327/74 |
| 6,836,127 | B2 * | 12/2004 | Marshall et al. | 324/606 |
| 7,061,305 | B2 * | 6/2006 | Kim | 327/535 |
| 7,382,167 | B1 * | 6/2008 | Umminger et al. | 327/76 |
| 7,714,620 | B1 * | 5/2010 | Xu | 327/63 |
| 2003/0020490 | A1 * | 1/2003 | Marshall et al. | 324/606 |
| 2007/0075748 | A1 * | 4/2007 | Bhattacharya et al. | 327/74 |

* cited by examiner

*Primary Examiner* — John Poos
(74) *Attorney, Agent, or Firm* — Winston Hsu; Scott Margo (57) ABSTRACT

A level sensitive comparing device includes: a first comparator, a second comparator, and a determination circuit. The first comparator is arranged for comparing an input signal with a first reference level to generate a first comparison signal. The second comparator is arranged for comparing the input signal with a second reference level to generate a second comparison signal, wherein the second reference level is different from the first reference level. The determination circuit is coupled to the first comparator and the second comparator, and is arranged for determining whether the first comparison signal is allowed to appear at an output of the level sensitive comparing device according to at least the first comparison signal and the second comparison signal, wherein the determination circuit is composed of digital components only.

16 Claims, 6 Drawing Sheets

LEVEL SENSITIVE COMPARING DEVICE

BACKGROUND

The present invention relates generally to signal conversion, and more particularly, to a level sensitive comparing device which ensures a square wave output of good quality.

Generally, a comparator is not level-sensitive such that a related-art clock extractor based on the non-level-sensitive comparator cannot ensure an output waveform is always an ideal square wave when a peak value of an input signal drops below a certain level. Such problem may be solved if the clock extractor is made to output a low level when the peak value of the input signal goes below a predetermined level.

Figure 1:
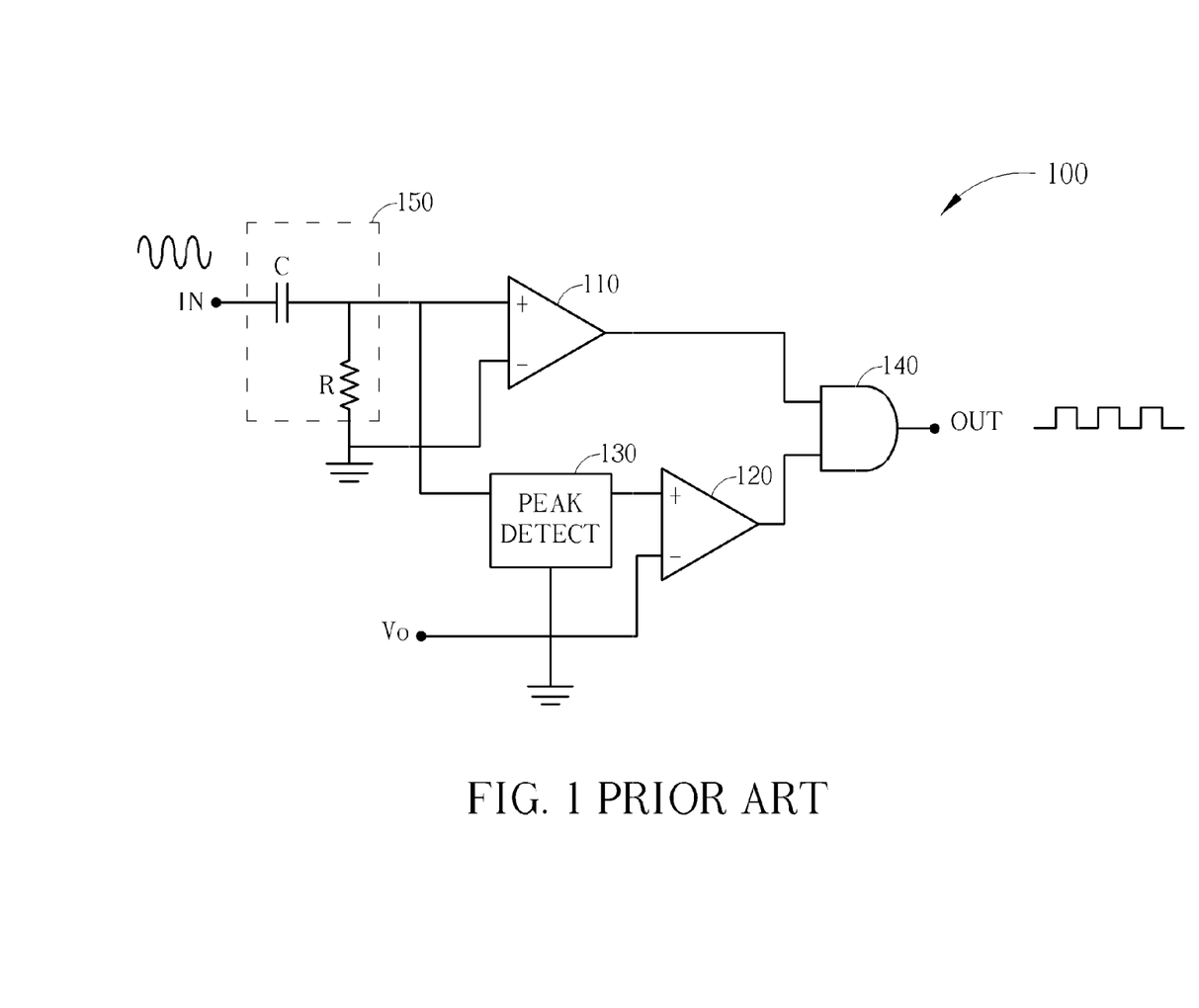
FIG. 1 is a diagram illustrating a related-art level sensitive comparing device.

A related art solution to address this problem is illustrated in FIG. 1. A level sensitive comparing device 100 is used to convert a sinusoidal wave or a near sinusoidal input wave to a square wave output. The level sensitive comparing device 100 includes a main comparator 110 which converts the sinusoidal wave input to the square wave output. A first-order RC high-pass filter 150 is used to change a DC level of the sine wave at IN to a desired one at an input of the comparator 110. A peak detector circuit 130 is used to determine a peak value of the input sine wave. The comparator 120 compares the peak value of the input sine wave with a reference voltage $V_O$. If the peak value of the input sine wave falls below $V_O$, the comparator 120 outputs a low level signal and the square wave output from the comparator 110 is prevented from reaching an terminal OUT by an AND gate 140. Otherwise, the comparator 120 outputs a high-level signal and the square wave output from the comparator 110 is passed to the terminal OUT by the AND gate 140.

A disadvantage of the above-mentioned level sensitive comparing circuit is the design of the peak detector 130. Since the peak detector is an analog circuit, requiring rectifiers (implemented with operational amplifiers) and capacitors to hold the peak value, a large area is required for integration of such circuits. Therefore, there is a need to provide a different level sensitive comparing circuit to address the problem encountered in the related art.

SUMMARY

With this in mind, it is one objective of the present invention to provide a level sensitive comparing device which comprises mostly digital components to generate a square wave according to a sinusoidal or near sinusoidal wave input.

According to one exemplary embodiment of the present invention, a level sensitive comparing device is provided, the level sensitive comparing device comprises: a first comparator, a second comparator, and a determination circuit. The first comparator is arranged for comparing an input signal with a first reference level to generate a first comparison signal. The second comparator is arranged for comparing the input signal with a second reference level to generate a second comparison signal, wherein the second reference level is different from the first reference level. The determination circuit is coupled to the first comparator and the second comparator, and is arranged for determining whether the first comparison signal is allowed to appear at an output of the level sensitive comparing device according to at least the first comparison signal and the second comparison signal, wherein the determination circuit is composed of digital components only.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Different features of the present invention are detailed as below in reference to the figures, and for convenience of explanation, the same elements in separate figures are indicated by the same reference numerals.

Figure 2:
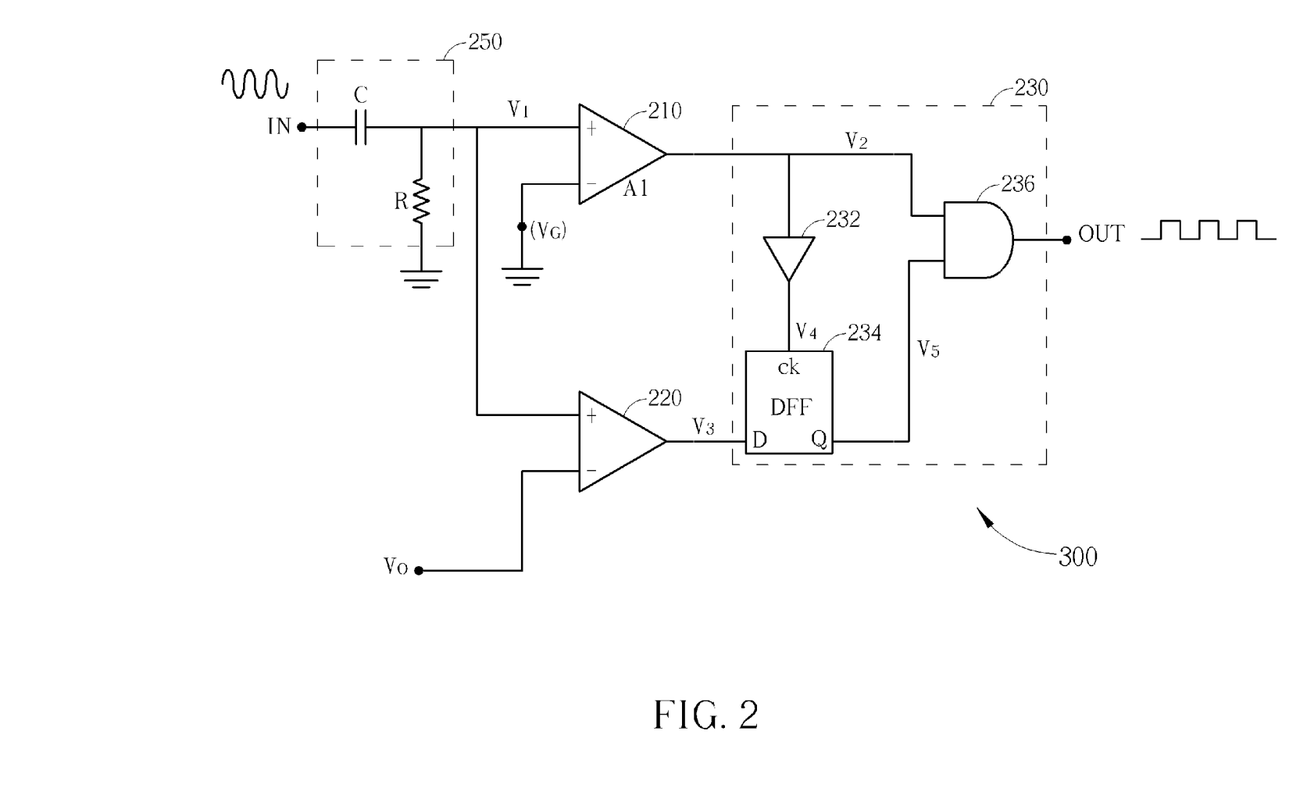
FIG. 2 is a diagram illustrating a level sensitive comparing device according to one exemplary embodiment of the present invention.

Please refer to FIG. 2, which illustrates a level sensitive comparing device according to one exemplary embodiment of the present invention. The level sensitive comparing device 200 comprises: comparators 210 and 220, and a determination circuit 230. The comparator 210 is arranged for comparing an input signal $V_1$ with a reference level $V_G$ to generate a first comparison signal $V_2$. The comparator 220 is arranged for comparing the input signal $V_1$ with a reference level $V_O$ to generate a second comparison signal $V_3$. Preferably, the reference level $V_O$ greater than the reference level $V_G$. The first comparison signal $V_2$ of the comparator 210 will be a square wave if the input signal $V_1$ is a sinusoidal wave which repeatedly crosses the reference level $V_G$.

The determination circuit 230 is coupled to the comparators 210 and 220, and is arranged for determining whether the first comparison signal $V_2$ is allowed to appear at an output OUT of the level sensitive comparing device 200 according to the first comparison signal $V_2$ and the second comparison signal $V_3$. As can be seen from FIG. 2, the determination circuit 230 is composed of digital components only, which greatly saves the circuit area. Therefore, the size of the inventive level sensitive comparing device 200 is much smaller than the related-art level sensitive comparing device 100.

The determination circuit 230 will provide a low-level signal at output OUT when a peak value of the input signal $V_1$ drops below a predetermined value, thereby ensuring a square wave of good quality (e.g. having a stead duty cycle). Hence, the determination circuit 230 allows the first comparison signal $V_2$ to appear at the output OUT of the level sensitive comparing device 100 when the input signal $V_1$ maintains beyond the reference level $V_O$ for a certain period after the input signal $V_1$ goes higher than the reference level $V_G$.

Figure 4:
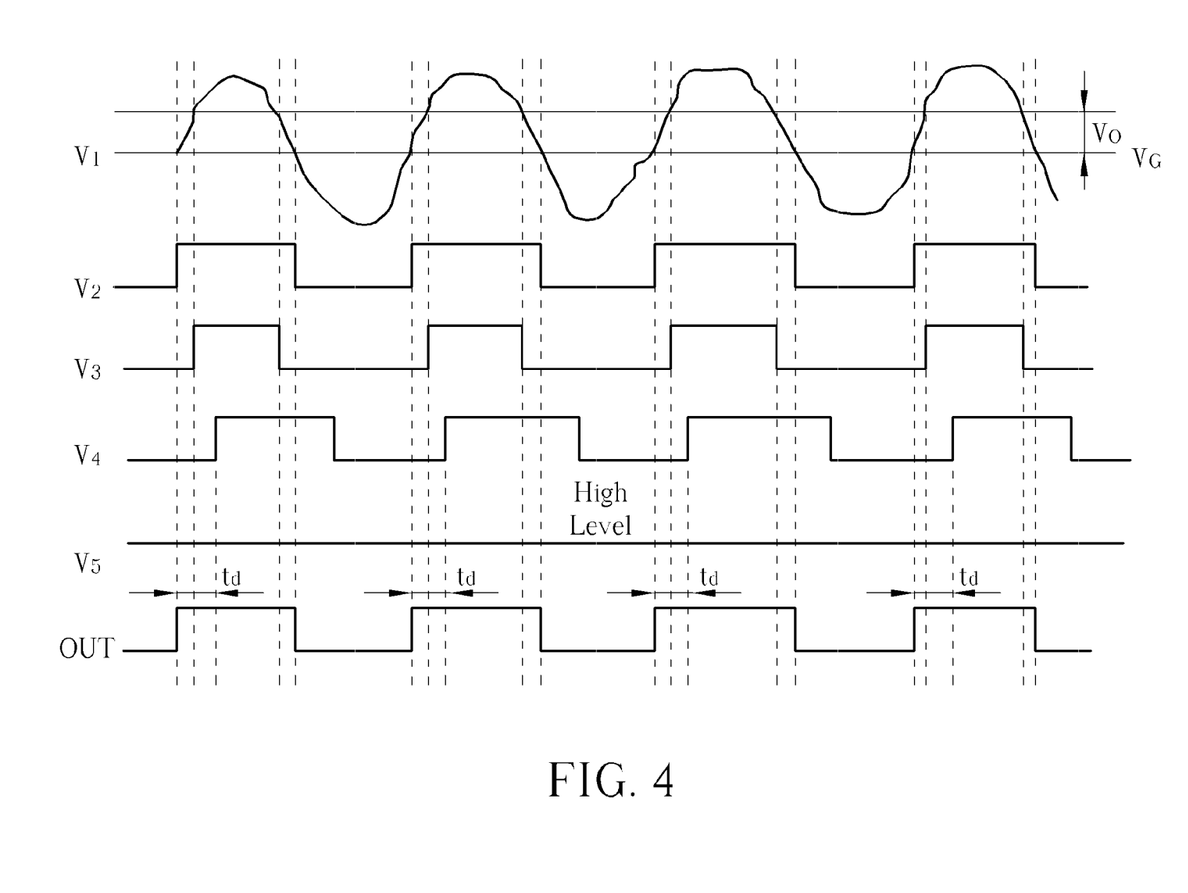
FIG. 4 and FIG. 5 are diagrams illustrating waveforms of signals at different nodes inside the level sensitive comparing device of FIG. 2 according to input signals having different levels.
Figure 5:
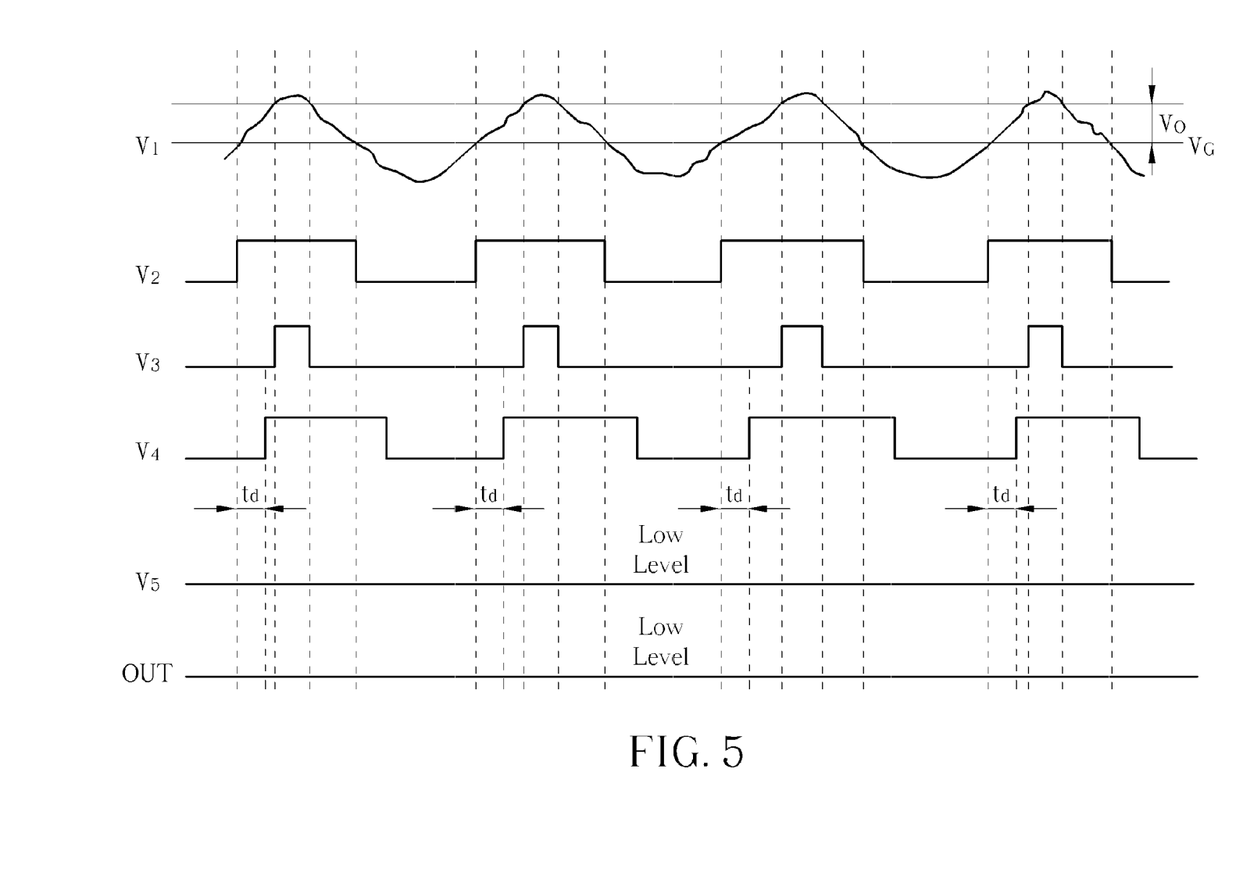

Please refer to FIG. 4 and FIG. 5, which respectively illustrate waveforms of signals at different nodes inside the level sensitive comparing device 200 when input signal $V_1$ has different levels. As can be seen from the drawings, the input signal $V_1$ as shown in FIG. 5 does not lead to the first comparison signal $V_2$ to appear at output OUT but leads to a low-level signal at output OUT since it only maintains beyond the reference level $V_O$ for a short period. However, the input signal $V_1$ as shown in FIG. 4 does lead to the first comparison signal $V_2$ to appear at output OUT of the level sensitive comparing device 200. This is because the input signal $V_1$ maintains beyond the reference level $V_O$ for a relative long period.

In one embodiment, the determination circuit 230 comprises: a first sampling circuit 234 and a logic circuit 236. The first sampling circuit 234, preferably a D-type flip flop (but not limited to), is coupled to the comparator 220, and is arranged for sampling the second comparison signal $V_3$ to generate a first sampled signal $V_5$ based on an edge of a triggering signal $V_4$. The logic circuit 236, preferably a AND gate (but not limited to) is coupled to the first sampling circuit 234, and is arranged for determining whether to allow the first comparison signal $V_2$ to appear at the output OUT of the level sensitive comparing device 200 according to the first sampled signal $V_5$ and the first comparison signal $V_2$.

In order to determine whether the input signal $V_1$ is high enough and maintains high for the period long enough to ensure the square wave of good quality, the determination circuit 230 utilizes the first sampling circuit 234 to comparing the levels of the first comparison signal $V_2$ and the second comparison signal $V_3$. The second comparison signal $V_3$ is sampled by the first sampling circuit 234 according to a trigger signal $V_4$ (provided by a delay circuit 232) which is a delayed version of the first comparison signal $V_2$. The level of the first sampled signal output $V_5$ is determined according to whether the second comparison signal $V_3$ is high or low at a rising edge of the trigger signal $V_4$. If the input signal $V_1$ maintains beyond the reference level $V_O$ long enough, the second comparison signal $V_3$ will be high at the rising edge of the trigger signal $V_4$, leading to the high of the first sampled signal $V_5$; otherwise, the first sampled signal $V_5$ will be low even if the second comparison signal $V_3$ is high. For example, as shown in FIG. 5, as the input signal $V_1$ only maintains beyond the reference level $V_O$ shortly, the second comparison signal $V_3$ go high after the rising edge of the triggering signal $V_4$. Hence, the first sampling circuit 234 will not generate the "high" first sampled signal $V_5$.

The amount of delay time $t_d$ determines how long is required for the input signal $V_1$ maintaining beyond the reference level $V_O$ to make the first comparison signal $V_2$ appear at the output OUT. In addition, the first comparison signal $V_2$ is allowed to appear at the output OUT depending on relative levels of the reference level $V_O$, a peak value $V_m$ input signal $V_1$ and the magnitude of delay time $t_d$ of delay circuit 232. Higher the value of reference level $V_O$, higher the peak value $V_m$ is required for the first sampled signal $V_5$ to be high to allow the first comparison signal $V_2$ to appear at output OUT. Higher the amount of delay time $t_d$, smaller the peak value $V_m$ is required for allowing the first comparison signal $V_2$ to appear at output OUT.

In one embodiment, the level sensitive comparing device 200 may have a filter 250, which may be a first-order high-pass filter. The filter 250 is coupled an input terminals of the comparators 210 and 200, and is arranged for filtering an original input signal $V_{IN}$ to generate the input signal $V_1$. If a period of the original input signal is T, the peak value of the input signal is $V_m$, the delay mount is $t_d$ and the second reference voltage is $V_O$, where the first comparison signal $V_2$ is allowed to appear at the output of the level sensitive comparing device when $V_O$ is greater than $V_m*\text{cosec}(2\pi*t_d/T)$.

Figure 3:
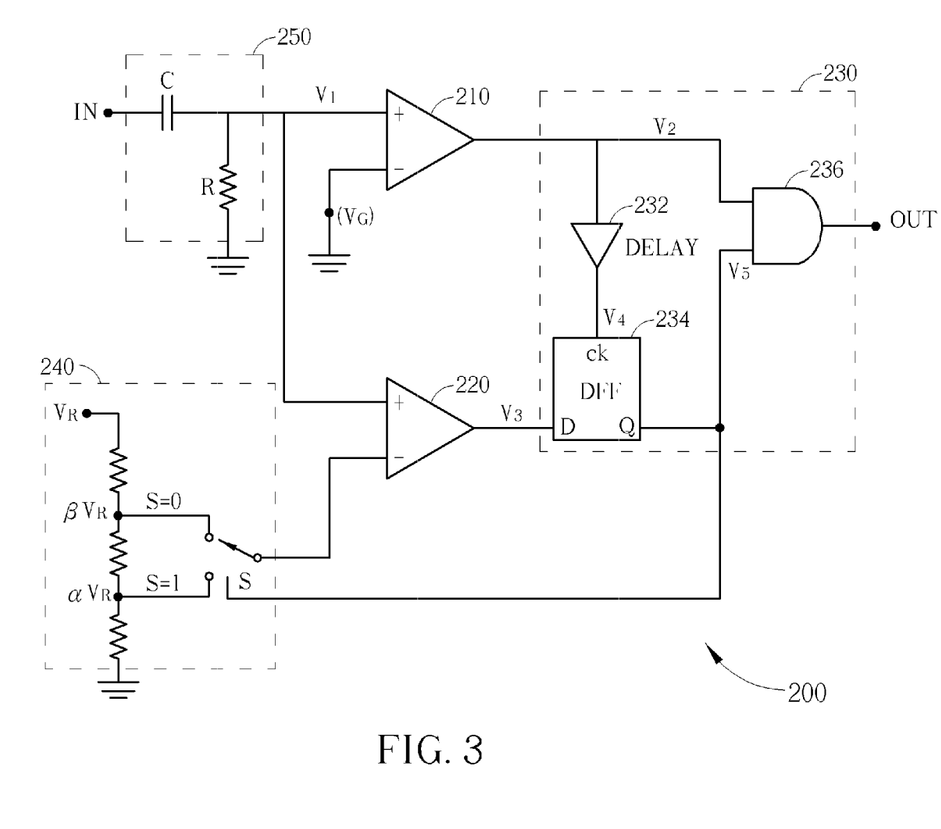
FIG. 3 is a diagram illustrating a level sensitive comparing device according to another exemplary embodiment of the present invention.

In one embodiment, the reference level $V_O$ may be a variable value. Please refer to FIG. 3, which illustrated a level sensitive comparing device 300 operates based on a variable reference level $V_O$. As can be seen, the reference level $V_O$ is provided by a level selection circuit 240. The level selection circuit 240 is coupled to an input terminal of the comparator 220, and is arranged for providing the reference level $V_O$ selected from a plurality of candidate reference levels $\alpha V_R$ or $\beta V_R$ according to the first sampled signal $V_5$. Candidate reference levels $\alpha V_R$ or $\beta V_R$ are generated from a master reference $V_R$ with a voltage divider network. Depending on whether the first sampled signal $V_5$ is high or low, a switch S selects $\alpha V_R$ or $\beta V_R$ to be the reference level $V_O$ respectively, where $\alpha$, $\beta<1$ and $\beta>\alpha$. When the first sampled signal is $V_5$ is high, the switch S selects $\alpha V_R$ as the reference level $V_O$; otherwise, the switch S selects $\beta VR$ as the reference level $V_O$. In this manner, some hysteresis may be provided, which prevents the first sampled signal $V_5$ from jittering such that the first sampled signal $V_5$ will not have a wrong transition due to jittering.

Figure 6:
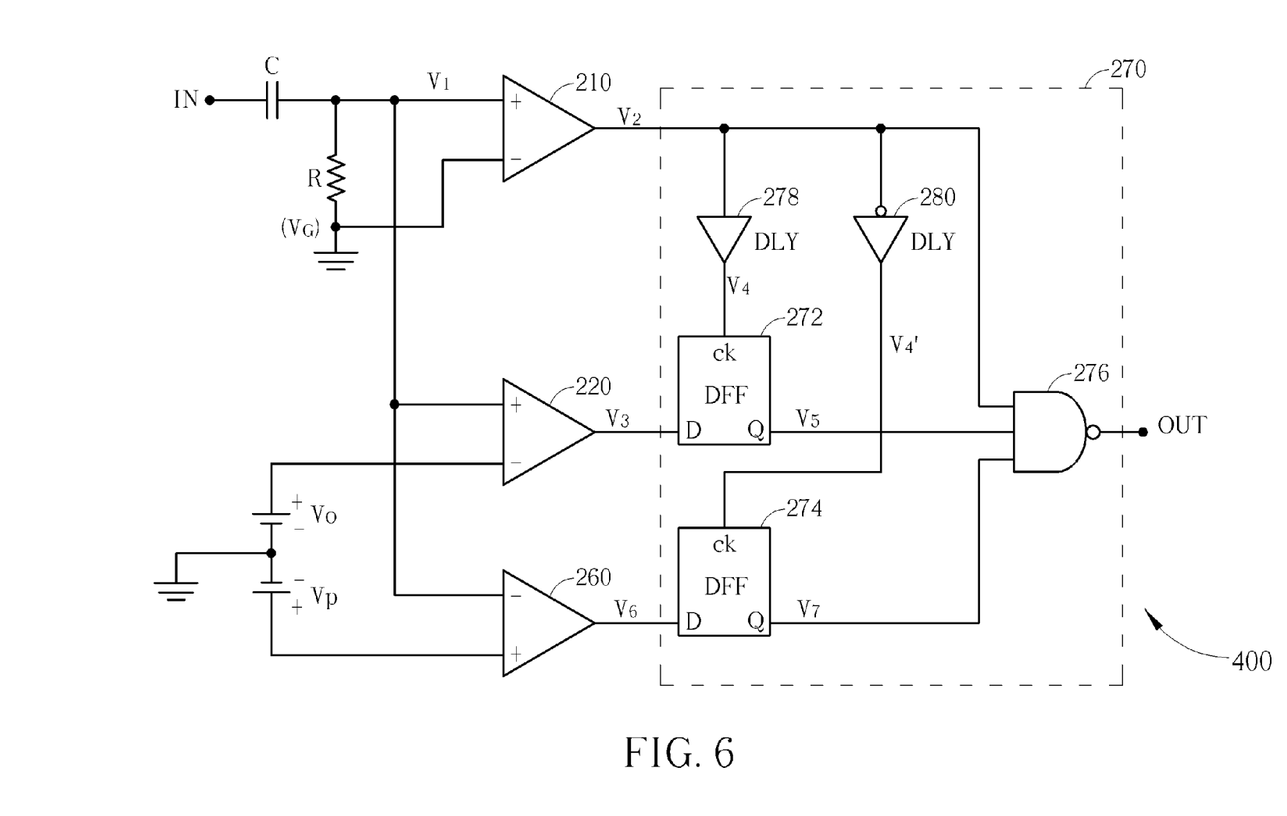
FIG. 6 is a diagram illustrating a level sensitive comparing device according to still another exemplary embodiment of the present invention.

Please refer to FIG. 6, which illustrate a level sensitive comparing device according to another exemplary embodiment of the present invention. In this embodiment, additional comparator and sampling circuit are included. Due to additional comparator and sampling circuit, the level sensitive comparing device caters for an asymmetrical input waveform.

The level sensitive comparing device 400 comprises: comparators 210, 220, and 260, and a determination circuit 230. The comparator 220 is arranged for comparing the input signal $V_1$ with the reference level $V_G$ to generate the first comparison signal $V_2$. The comparator 220 is arranged for comparing the input signal $V_1$ with the reference level $V_O$ to generate the second comparison signal $V_3$. The comparator 260 is arranged for comparing the input signal $V_1$ with a reference level $V_P$ to generate a third comparison signal $V_6$. Preferably, the reference level $V_P$ is a negative of the reference level $V_O$ and the reference level $V_O$ is higher than the reference level $V_G$. However, the present invention is not limited in scope to the above-mentioned level selection. The comparator 220 takes care of the input signal $V_1$ by determining whether the positive peak value $V_m$ of the input signal $V_1$ is higher than the reference level $V_O$. If yes, the second comparison signal $V_3$ will be high. The comparator 260 takes care of the negative part of the input signal $V_1$ by determining whether a negative peak value $V_n$ of the input signal $V_1$ is lower than the reference level $V_P$. If yes, the third comparison signal $V_6$ will be high.

The determination circuit 270 is coupled to the comparators, 210, 220 and 260, and determines whether the first comparison signal $V_2$ is allowed to appear at the output OUT of the level sensitive comparing device 400 according to the first comparison signal $V_2$, the second comparison signal $V_3$ and the third comparison signal $V_6$. The determination circuit 270 comprises: a first sampling circuit 272, and a second sampling circuit 274, a logic circuit 276, a first delay circuit 278 and a second delay circuit 280. The first sampling circuit 272, preferably a D-type flip-flop (but not limited to) is arranged for sampling the second comparison signal $V_3$ to generate the first sampled signal $V_5$ based the triggering signal $V_4$ (which is a delayed version of the first comparison signal $V_2$ by the delay circuit 278 delaying the first comparison signal $V_2$). As mentioned above, the first sampling circuit 272 is able to determine whether the input signal $V_1$ is high enough and maintains high for a period long enough to ensure a square wave output of good quality. Similar, the second sampling circuit 274 is arranged for sampling the third comparison signal $V_6$ to generate a second sampled signal $V_7$ based on a triggering signal $V_4'$ (which is a delayed and inverted version of the first comparison signal $V_2$ generated by the delay circuit 280 delaying and inverting the first comparison signal $V_2$). The second sampling circuit 274, preferably a D-type flip-flop (but not limited to), is able to determine whether the input signal $V_1$ is low enough and maintains low for a period long enough to ensure the square wave output of good quality. The logic circuit 276, preferably a NAND gate (but not limited to), is arranged for determining whether to allow the first comparison signal $V_1$ to appear at the output OUT of the level sensitive comparing device 400. If both of the first sampling circuit 272 and the second sampling circuit 274 is high, the NAND gate 276 pass the first comparison signal $V_1$ to the output OUT of the level sensitive comparing device 400.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

In conclusion, the present invention utilizes mostly digital components to accomplish the level sensitive comparing device, eliminating the use of a peak detector, thus saving a lot of area. The inventive level sensitive comparing device is able to provide a square wave of good quality while the input sinusoidal wave is high enough and/or low enough, and provides a low-level output while the sinusoidal wave is not high enough and/or not low enough. Therefore, the inventive level sensitive comparing device can be applied to clock extraction to provide an ideal clock signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level sensitive comparing device, comprising:
   a first comparator, arranged for comparing an input signal with a first reference level to generate a first comparison signal;
   a second comparator, arranged for comparing the input signal with a second reference level to generate a second comparison signal, wherein the second reference level is different from the first reference level; and
   a determination circuit, coupled to the first comparator and the second comparator, arranged for determining whether the first comparison signal is allowed to appear at an output of the level sensitive comparing device according to at least the first comparison signal and the second comparison signal, wherein the determination circuit is composed of digital components only, wherein the determination circuit further comprises:
   a first sampling circuit, coupled to the second comparator, arranged for sampling the second comparison signal to generate a first sampled signal based on an edge of a triggering signal derived from the first comparison signal; and
   a logic circuit, coupled to the first sampling circuit, arranged for determining whether to allow the first comparison signal to appear at the output of the level sensitive comparing device according to the first sampled signal;
   wherein the first sampled signal has a first level when the input signal maintains beyond the second reference level for the certain period after the input signal rises higher than the first reference level;
   otherwise the first sampled signal has a second level.

2. The level sensitive comparing device of claim 1, wherein the second reference level is higher than the first reference level.

3. The level sensitive comparing device of claim 1, wherein the first comparison signal is allowed to appear at the output of the level sensitive comparing device when the input signal maintains beyond the second reference level for a certain period after the input signal rises higher than the first reference level.

4. The level sensitive comparing device of claim 1,
   wherein the determination circuit further comprises:
   a delay circuit, coupled to the first comparator and the first sampling circuit, arranged for delaying the first comparison signal with a delay amount to generate the triggering signal.

5. The level sensitive comparing device of claim 4, further comprising:
   a filter, coupled to an input terminal of the first comparator and an input terminal of the second comparator, arranged for filtering an original input signal to generate the input signal;
   wherein a period of the original input signal is T, a peak value of the input signal is $V_m$, the delay mount is $t_d$ and the second reference voltage is $V_O$, where the first comparison signal is allowed to appear at the output of the level sensitive comparing device when $V_O$ is greater than $V_m * \cosec(2\pi * t_d/T)$.

6. The level sensitive comparing device of claim 1, further comprising:
   a level selection circuit, coupled to an input terminal of the second comparator, arranged for providing the second reference level by selecting one of a plurality of candidate reference levels according to the first sampled signal.

7. The level sensitive comparing device of claim 6, wherein the level selection circuit selects a first candidate reference level as the second reference level when the sampled signal has the first level, and the level selection circuit selects a second candidate reference level as the second reference level when the sampled signal has the second level, where the first candidate level is lower than the second candidate level.

8. The level sensitive comparing device of claim 1, wherein the logic circuit is an AND gate.

9. The level sensitive comparing device of claim 1, wherein the first sampling circuit is a D-type flip-flop, and the D-type flip flop captures a value of the second comparison signal at a rising edge of the triggering signal.

10. The level sensitive comparing device of claim 1, further comprising:
a third comparator, for comparing the input signal with a third reference level to generate a third comparison signal, wherein the third reference level is different from the first reference level and the second reference level;
wherein the determination circuit is coupled to the first comparator, the second comparator and the third comparator, and determines whether the first comparison signal is allowed to appear at the output of the level sensitive comparing device according to the first comparison signal, the second comparison signal and the third comparison signal.

11. The level sensitive comparing device of claim 10, wherein a voltage difference between the second reference level and the first reference level is equal to a voltage difference between the first reference level and the third reference level.

12. The level sensitive comparing device of claim 10, wherein the determination circuit comprises:
a first sampling circuit, coupled to the second comparator, arranged for sampling the second comparison signal to generate a first sampled signal based on an edge of a triggering signal derived from the first comparison signal;
a second sampling circuit, coupled to the third comparator, arranged for sampling the third comparison signal to generate a second sampled signal based on the edge of the triggering signal; and
a logic circuit, coupled to the first sampling circuit and the second sampling signal, arranged for determining whether to allow the first comparison signal to appear at the output of the level sensitive comparing device according to the first sampled signal and the second sampled signal.

13. The level sensitive comparing device of claim 12, wherein the determination circuit further comprises:
a first delay circuit, coupled to the first comparator and the first sampling circuit, arranged for delaying the first comparison signal to generate a first delayed signal, wherein the first sampling circuit samples the second comparison signal to generate the first sampled signal based on an edge of the first delayed signal; and
a second delay circuit, coupled to the first comparator and the second sampling circuit, arranged for delaying and inverting the first comparison signal to generate a second delayed signal, wherein the second sampling circuit samples the third comparison signal to generate the second sampled signal based on an edge of the second delayed signal.

14. The level sensitive comparing device of claim 12, wherein the logic circuit is a NAND gate.

15. The level sensitive comparing device of claim 12, wherein each of the first sampling circuit and the second sampling circuit is a D-type flip-flop.

16. The level sensitive comparing device of claim 1, wherein the input signal is a sinusoidal wave signal.

* * * * *